(12) United States Patent
Schmidtlein et al.

(10) Patent No.: US 12,038,466 B2
(45) Date of Patent: Jul. 16, 2024

(54) TESTING APPARATUS, CONTROL DEVICE SYSTEM, AND TESTING METHOD (71) Applicant: Robert Bosch GmbH, Stuttgart (DE)

(72) Inventors: Andreas Schmidtlein, Tamm (DE); Simeon Lange, Mundelsheim (DE)

(73) Assignee: ROBERT BOSCH GMBH, Stuttgart (DE)

(*) Notice: Subject to any disclaimer, the term of this patent is extended or adjusted under 35 U.S.C. 154(b) by 125 days.

(21) Appl. No.: 17/793,033

(22) PCT Filed: Apr. 8, 2021

(86) PCT No.: PCT/EP2021/059181
§ 371 (c)(1),
(2) Date: Jul. 14, 2022

(87) PCT Pub. No.: WO2021/209309
PCT Pub. Date: Oct. 21, 2021

(65) Prior Publication Data
US 2023/0038552 A1 Feb. 9, 2023

(30) Foreign Application Priority Data
Apr. 15, 2020 (DE) .................. 10 2020 204 733.2

(51) Int. Cl.
G01R 31/12 (2020.01)
G01R 31/00 (2006.01)

(52) U.S. Cl.
CPC ....... *G01R 31/1218* (2013.01); *G01R 31/006* (2013.01)

(58) Field of Classification Search
CPC .............. G01R 31/1218; G01R 31/006; G01R 31/2817; G01R 31/2844; G01R 31/2849; G01R 31/2841
See application file for complete search history.

(56) References Cited

U.S. PATENT DOCUMENTS 2,766,400 A * 10/1956 Clark ..................... G01R 13/28
315/395
3,331,252 A * 7/1967 Thomas ................. G01H 1/003
73/462

(Continued)

FOREIGN PATENT DOCUMENTS

CN   104576613 A   4/2015
CN   111007387 A   4/2020

(Continued)

OTHER PUBLICATIONS

International Search Report for PCT/EP2021/059181, Issued Sep. 6, 2021.

(Continued)

*Primary Examiner* — Lee E Rodak
*Assistant Examiner* — Demetrius R Pretlow
(74) *Attorney, Agent, or Firm* — NORTON ROSE FULBRIGHT US LLP; Gerard A. Messina (57) ABSTRACT

A testing apparatus for testing electrical components and/or conductor track structures. The testing apparatus includes: a multiplicity of testing locations, each receiving an electrical component and/or a conductor track structure; a selection device for selecting one of the testing locations; electrical lines disposed in rows and electrical lines disposed in columns for the supply of an alternating voltage to the component or structure, situated at the selected testing location; Z diodes for the electrical connection of the respective component and/or structure at the respective testing location via one of the Z diodes to one of the rows of electrical lines; a signal generator developed to generate a test signal that has a voltage signal as the sum of a square wave signal and a wave-shaped signal; and an electromigration device for applying a direct voltage signal to the (Continued)

components and/or structures to bring about electromigration in the components and/or structures.

12 Claims, 3 Drawing Sheets

(56) References Cited

U.S. PATENT DOCUMENTS

| | | | | |
|---|---|---|---|---|
| 5,291,142 | A * | 3/1994 | Ohmi | G01N 27/041 |
| | | | | 324/703 |
| 5,760,595 | A * | 6/1998 | Edwards | G01R 31/2863 |
| | | | | 219/209 |
| 6,831,474 | B2 * | 12/2004 | Kollmer | G01R 31/275 |
| | | | | 324/762.09 |
| 7,394,280 | B1 * | 7/2008 | Low | G01R 31/2858 |
| | | | | 324/719 |
| 8,237,458 | B2 * | 8/2012 | Federspiel | G01R 31/2858 |
| | | | | 324/750.06 |
| 10,732,216 | B2 * | 8/2020 | Chen | G01R 31/2642 |
| 2003/0080761 | A1 * | 5/2003 | Filippi, Jr. | H01L 22/34 |
| | | | | 324/719 |
| 2004/0262988 | A1 * | 12/2004 | Kolarsky | B60T 8/5006 |
| | | | | 303/20 |
| 2006/0125494 | A1 * | 6/2006 | Von Hagen | G01R 31/2648 |
| | | | | 324/722 |
| 2006/0192904 | A1 * | 8/2006 | Almogy | G01R 31/2812 |
| | | | | 382/128 |
| 2010/0327892 | A1 * | 12/2010 | Agarwal | G01R 31/2858 |
| | | | | 324/750.3 |
| 2015/0153413 | A1 * | 6/2015 | Hasse | G01R 31/005 |
| | | | | 324/750.01 |
| 2017/0242068 | A1 | 8/2017 | Le et al. | |
| 2017/0356957 | A1 * | 12/2017 | McMullen | G01R 31/2858 |

FOREIGN PATENT DOCUMENTS

| | | |
|---|---|---|
| JP | S60205935 A | 10/1985 |
| JP | H01257897 A | 10/1989 |
| JP | H05119118 A | 5/1993 |
| JP | H10116004 A | 5/1998 |
| JP | 2008235596 A | 10/2008 |

OTHER PUBLICATIONS

Zhou et al., "Electromigration Effects in Power Grids Characterized Using an On-Chip Teststructure With Poly Heaters and Voltage Tapping Points," 2018 IEEE Symposium on VLSI Technology, IEEE, 2018, pp. 1-2. <extension://elhekieabhbkpmcefcoobjddigjcaadp/http://people.ece.umn.edu/groups/VLSIresearch/papers/2018/VLSI18_EM.pd> Downloaded Jul. 14, 2022.

Zhou et al., "A Circuit-Based Approach for Characterizing High Frequency Electromigration Effects," IEEE Transactions on Device and Materials Reliability, vol. 17, No. 4, 2017, pp. 763-772.

Yassine et al., "Electromigration Noise Measurements Using a Novel AC/DC Wafer-Level Noise Measurement System," IEEE Transactions on Electron Devices, vol. 44, No. 1, 1997, pp. 180-184.

Trigg et al., "Single Current Source Electromigration System and Its Application to Copper Pillars With Tin Based Solder," 2013 IEEE 15th Electronics Packaging Technology Conference (EPTC2013), IEEE, 2013, pp. 147-151.

* cited by examiner

TESTING APPARATUS, CONTROL DEVICE SYSTEM, AND TESTING METHOD

FIELD

The present invention relates to a testing apparatus, a control device system and a testing method.

BACKGROUND INFORMATION

At the present time, moisture-induced faulty images resulting from electromigration in electronic components and/or conductor track structures are typically difficult to predict and can be examined in a laboratory only at considerable expense. This usually makes it especially difficult to perform knowledge-based design adaptations based on clear arithmetic rules that suppress undesired faulty images in electronic components and/or conductor track structures. Similar difficulties are generally encountered when modeling such causally induced fault structures developed on an experimental basis using large statistics.

SUMMARY

The present invention provides a testing apparatus and a control device system or a testing method. Advantageous refinements and improvements of the present invention result from the disclosure herein.

In an advantageous manner, embodiments of the present invention may make it possible to examine electromigration in a multitude of electronic components and/or conductor track structures within a short period of time.

According to a first aspect of the present invention, a testing apparatus is provided for testing electrical components and/or conductor track structures, in particular comb structures. In accordance with an example embodiment of the present invention, the testing apparatus has a multiplicity of testing locations for receiving an electrical component and/or a conductor track structure in each case, and the testing apparatus furthermore has a selection device for selecting one of the testing locations, the testing apparatus has electric lines disposed in rows and electrical lines disposed in columns for the supply of an alternating voltage to an electrical component situated at the selected testing location and/or a conductor track structure situated at the selected testing location, the testing apparatus has Z diodes for the electrical connection of the respective electrical component and/or the respective conductor track structure at the respective testing location via one of the Z diodes to one of the rows of electrical lines, and a signal generator, the signal generator being developed to generate a test signal, which has a voltage signal as the sum of a square wave signal and a wave-shaped signal, in particular a sine signal, and the maximum voltage of the square wave signal corresponding at least to the breakdown voltage of the respective Z diode of the selected testing location, characterized by an electromigration device for applying a direct voltage signal to the electrical components and/or the conductor track structures in order to produce an electromigration in the electrical components and/or the conductor track structures, the voltage of the direct voltage signal being greater than the breakdown voltage of the respective Z diode of the selected testing location.

One advantage of this is that the electromigration is able to be examined in a multitude of electronic components and/or conductor track structures within a very short period of time. As a result, very large statistics of experimental data may be generated. By applying a direct voltage which is greater than the breakdown voltage of the Z diodes between the lines and rows, an electromigration in a multitude of electronic components and/or conductor track structures can be generated, which is then able to be examined with the aid of a test signal. After the direct voltage for producing the electromigration has been applied, the electronic components and/or the conductor track structures are able to be measured individually with the aid of the lines and columns. It is possible that the electronic components and/or conductor track structures are identical in their development. However, it is also possible that the electronic components and/or conductor track structures have a slightly different design, which makes it possible to examine the dynamics and/or non-linearities when electromigration is produced in the electronic components and/or conductor track structures.

According to a second aspect of the present invention, a control device system for a motor vehicle is provided, the control device system has a control device for the control of at least parts of the motor vehicle, and a testing apparatus as described above, the control device system being developed in such a way that a higher or longer lasting direct voltage signal is applied to the electrical components and/or conductor track structures of the matrix structure, and/or a higher field strength of the electrical field is applied (e.g., by smaller geometrical distances) than to the electrical components and/or the conductor track structures of the control device.

This has the advantage that the matrix structure as the sacrificial structure and/or measuring structure is able to be used for a reliable error prediction in the control device and consequently for a failure prevention of the control device, in particular for autonomous motor vehicles. The matrix structure may be placed at a location where the environment is similar to that in the control device. The matrix structure is able to be placed at a location where the environment parameters are particularly electromigration-friendly. Thus, an electrical component and/or a conductor track structure of the matrix structure fail(s) before a failure of an electrical component or a conductor track structure of the control device occurs. This makes it possible to give a timely warning to the driver of the motor vehicle that a failure of the control device is imminent. The electrical field applied to the matrix structure or the electrical component or to the conductor track structure is able to be applied in a vehicle-type-specific manner, that is, the environment variables influenced by the motor vehicle architecture or the motor vehicle design such as the mean ambient temperature, etc. may be taken into account in the predictive failure calculation.

According to a third aspect of the present invention, a method for testing electrical components and/or conductor track structures situated at testing locations of a testing apparatus is provided, in particular a testing apparatus as described above, the testing apparatus having a multitude of testing locations for receiving an electrical component and/or a conductor track structure in each case and having electrical lines disposed in rows and electrical lines disposed in columns for the supply of an alternating voltage to the electrical component disposed at the selected testing location and/or of the conductor track structure disposed at the selected testing location, the testing apparatus having Z diodes for the electrical connection of the respective electrical component and/or the respective conductor track structure at the respective testing location via one of the Z diodes to one of the rows of electrical lines. In accordance with an example embodiment of the present invention, the method includes the following steps: applying a direct voltage signal to one or more electrical component(s) and/or to one or more conductor track structure(s) with the aid of the rows of electrical lines and the columns of the electrical lines in order to produce electromigration in the respective electrical component and/or the respective conductor track structure, the voltage of the direct voltage signal being greater than the breakdown voltage of the respective Z diode of the electrical component and/or the conductor track structure; selecting a testing location with the aid of the rows of electrical lines and the columns of electrical lines; and supplying the electrical component situated at the selected testing location and/or the conductor track structure situated at the selected testing location with a test signal which has a voltage signal as the sum of a square wave signal and a wave-shaped signal, in particular a sine signal, and the maximum voltage of the square wave signal corresponding at least to the breakdown voltage of the Z diode of the selected testing location.

This has the advantage that this method makes it possible to examine the electromigration in a multitude of electronic components and/or conductor track structures within a very short time period. Very large statistics of experimental data are therefore able to be generated. By applying a direct voltage greater than the breakdown voltage of the Z diodes between the lines and rows, an electromigration is able to be produced in a multitude of electronic components or conductor track structures, which is then examined with the aid of a test signal. The use of the present method makes it possible to individually measure the electronic components and/or the conductor track structures once the direct voltage has been applied to produce the electromigration with the aid of the lines and columns. It is possible that the electronic components and/or the conductor track structures have the same design.

A use of an electrical component tested utilizing the afore-described method and/or a conductor track structure tested utilizing the afore-described method as a sacrificial structure for a control device is also possible, in accordance with the present invention. This allows for a timely warning before a failure of the control device is imminent. For example, an electronic component and/or a conductor track structure whose design is particularly resistant or robust to electromigration is/are able to be selected with the aid of the described method. This electrical component and/or this conductor track structure may also be part of the control device or be installed in this control device in order to obtain a control device that is particularly resistant to electromigration.

Ideas in connection with embodiments of the present invention may be considered to be based, among others, on the thoughts and recognitions described in the following text.

The present invention is based on a main feature of examining electromigration in a multitude of electronic components and/or conductor track structures with the aid of a matrix structure.

According to one example embodiment of the testing apparatus, the testing apparatus furthermore includes a camera for detecting electromigration structures of the electrical components and/or the conductor track structures. This has the advantage that in addition to the electrical measurement, the produced electromigration structures are able to be optically acquired and then stored in a technically uncomplicated manner. In particular, the optically acquired electromigration structures together with the environment variable are able to be used to optimize the chemical material composition of the electronic component and/or the conductor track structure in an effort to minimize the electromigration.

According to one example embodiment of the testing apparatus, the testing apparatus furthermore includes a classification device for classifying the electromigration structures acquired by the camera. This offers the advantage that the acquired electromigration structures are statistically easy to examine and/or analyze. As a result, the design of the electrical components and/or of the conductor track structures is technically easy to analyze and improve to minimize the electromigration.

According to one example embodiment of the testing apparatus, the classification device is designed to classify the electromigration structures acquired by the camera with the aid of machine learning. This offers the advantage that the machine learning system is able to provide suggestions for improving the design of the electronic components and/or conductor track structures to reduce the electromigration. This may lead to novel design approaches or design changes.

According to one embodiment of the testing apparatus, the classification device is designed to assign the electromigration structures acquired by the camera to fractals and/or to a fractal dimension in each case. This is advantageous insofar as the number of classification classes is able to be greatly reduced and the statistical analysis is therefore particularly easy to carry out.

According to one embodiment of the present method, electromigration structures of the electrical components and/or the conductor track structures are acquired in an optical manner. One advantage of this approach is that in addition to the electrical measurement of the electronic components and/or conductor track structures, the changes in the electrical components and/or the conductor track structures are able to be optically acquired and stored. In particular, the optically acquired electromigration structures together with the environment variable may be used to optimize the chemical material composition of the electronic component and/or the conductor track structure in order to minimize the electromigration.

According to one example embodiment of the present invention, the optically acquired electromigration structures are classified, in particular with the aid of machine learning. One advantage of this is that the electromigration structures can be statistically examined and analyzed in a technically simple manner. As a result, the design of the electrical components and/or the conductor track structures is able to be analyzed and improved in a technically uncomplicated manner so that the electromigration is minimized. Using a machine learning system, suggestions can be generated for improving the design of the electronic components and/or the conductor track structures so that the electromigration can be reduced. The use of a machine learning system may thus lead to novel design approaches and design changes of the electronic components and/or the conductor track structures.

According to one example embodiment of the present invention, the optically acquired electromigration structures are assigned to fractals, in particular to Julia sets, and/or a fractal dimension in each case. This is advantageous insofar as this method greatly reduces the number of classification classes. The statistical analysis of the data can therefore be carried out in a particularly simple manner.

According to one example embodiment of the present invention, at least a portion of the electrical components and/or the conductor track structures has a different design.

One advantage of this is that a multitude of different designs/development types of the electrical component and/or the conductor track structure, in particular slight variations of a basic structure of the electrical component and/or the circuit structure, is able to be examined and/or tested very rapidly within a short time. Especially when the electronic components and/or the conductor track structures differ slightly in their design, it is possible to examine the dynamics and/or nonlinearities in the production of electromigration.

It is pointed out that some of the possible features and advantages of the present invention are described herein with reference to different embodiments of the testing apparatus and/or the testing method. In view of the disclosure herein, one skilled in the art recognizes that the features are able to be suitably combined, adapted or exchanged in order to obtain further embodiments of the present invention.

BRIEF DESCRIPTION OF THE DRAWINGS

In the following text, example embodiments of the present invention will be described with reference to the figures, but neither the figures nor the description should be considered a restriction of the present invention.

BRIEF DESCRIPTION OF THE DRAWINGS

The figures are merely schematic and not true to scale. Identical reference numerals in the figures denote the same or equivalently features.

DETAILED DESCRIPTION OF EXAMPLE EMBODIMENTS

Figure 1:
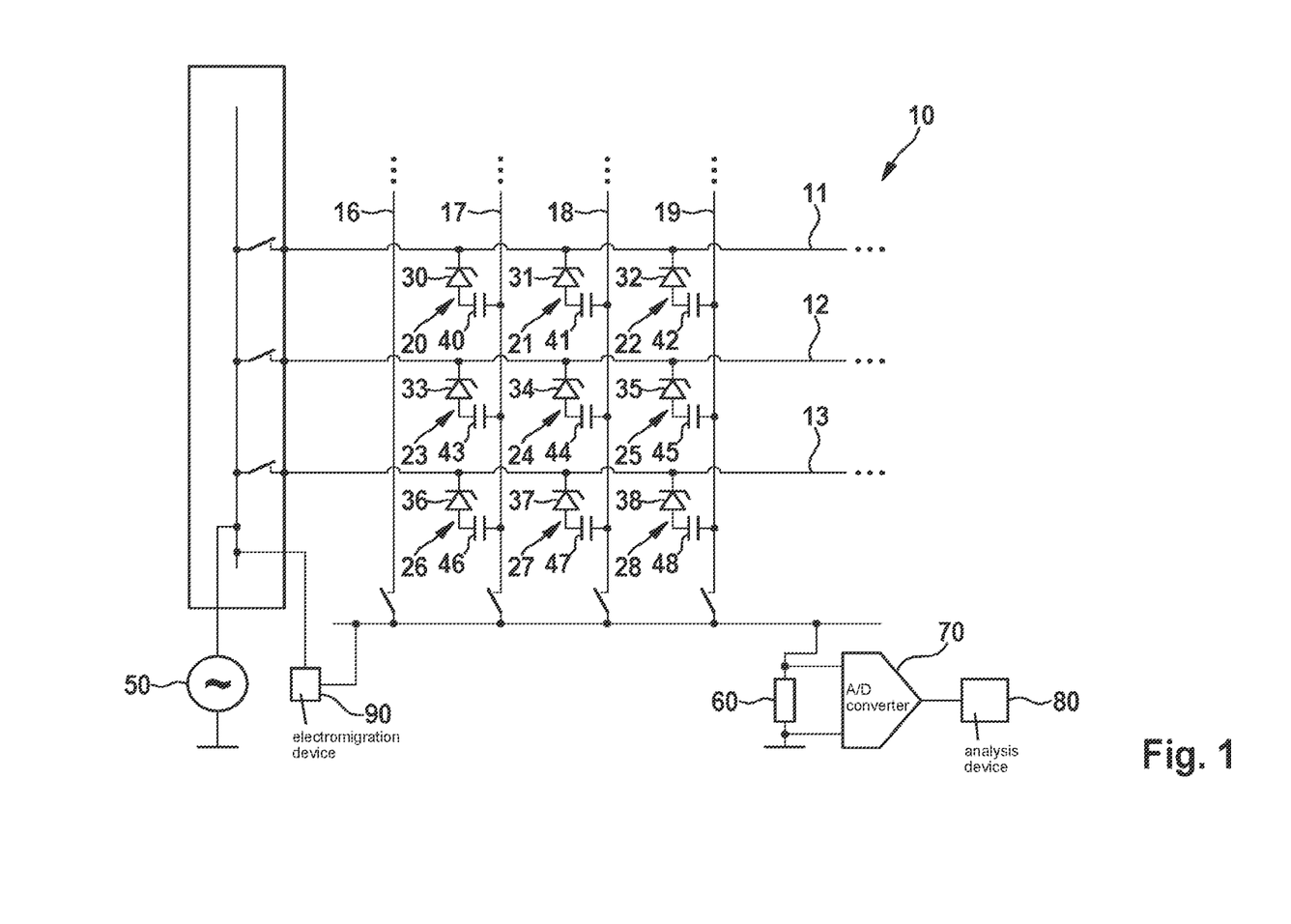
FIG. 1 shows a schematic top view of a first example embodiment of the testing apparatus according to the present invention.
Figure 2:
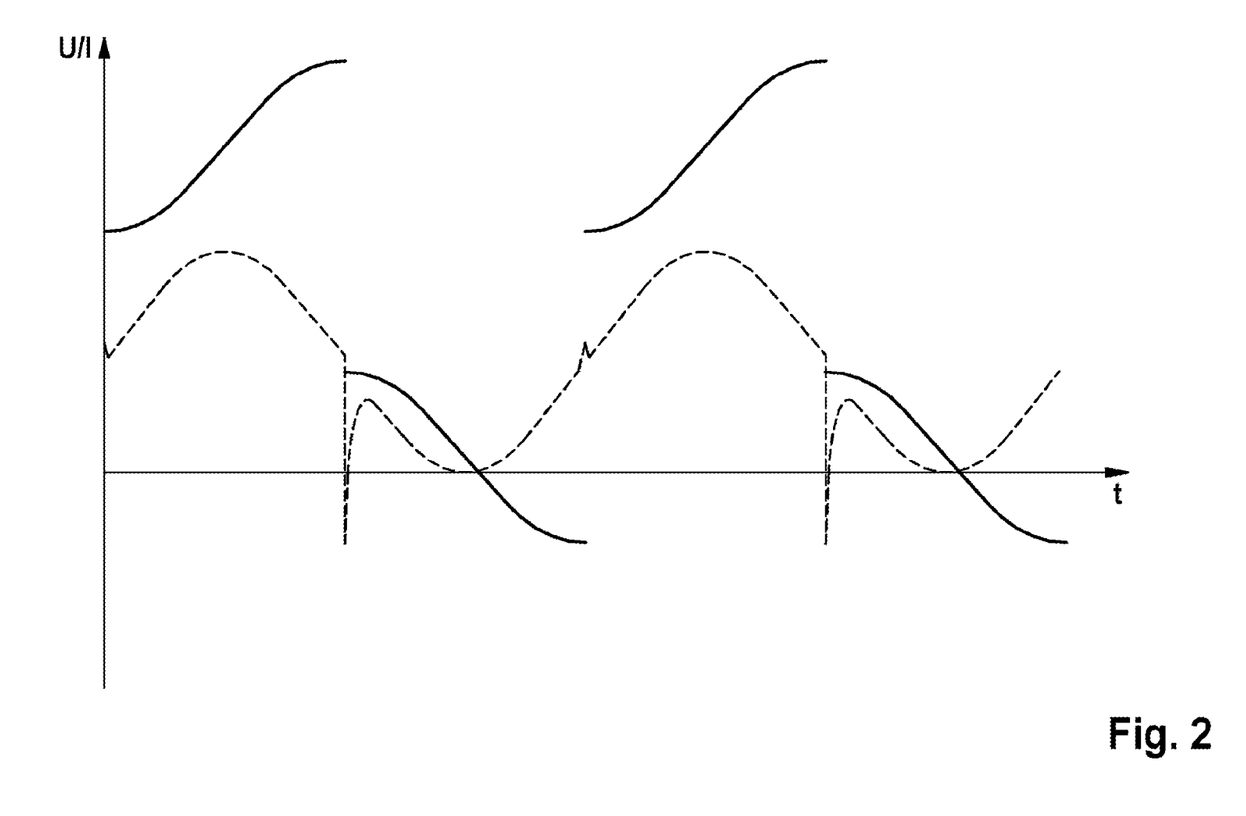
FIG. 2 shows a diagram of the test signal and the resulting current in the testing of the electronic components.

FIG. 1 shows a schematic top view of a first embodiment of the testing apparatus according to the present invention. FIG. 2 shows a diagram of the test signal and the resulting current during the testing of the electronic components and/or the conductor track structures.

Testing apparatus 10 is designed to test and/or check a multitude of electrical components 40-48 and/or conductor track structures. Electrical components 40-48 may be capacitors, for instance, as illustrated in FIG. 1. Coils, resistors, inductivities, etc. may also be used as electrical components 40-48.

Testing apparatus 10 has a multitude (e.g., several dozen, several hundred or several thousand) testing locations 20-28. Each testing location 20-28 is designed to receive an electrical component 40-48. It is also conceivable that multiple electrical components 40-48 are received at testing location 20-28.

Testing apparatus 10 includes a matrix structure, which has rows 11-13 of electrical lines and columns 16-19 of electrical lines. Each testing location 20-28 is electrically connected to precisely one row 11-13 and precisely one column 16-19. Each testing location 20-28 is connected via a Z diode 30-38 to a row 11-13 of the electrical lines, while each testing location 20-28 is connected, without further interspersed elements (that is, directly), to a column 16-19 of the electrical lines. In this way, an appropriate selection or supply of respective row 11-13 and column 16-19 with an alternating voltage makes it possible to select precisely one testing location 20-28, which is supplied with an alternating voltage.

Rows 11-13 may be exchanged for columns 16-19, which means that in this application the electrical lines denoted as "rows" may be "columns" and vice versa.

At each testing location 20-28, electrical component 40-48 is able to be positioned in testing apparatus 10 and connected to a row 11-13 and a column 16-19 of the electrical lines.

Rows 11-13 of testing apparatus 10 are electrically connected to a signal generator 50 of testing apparatus 10, which generates an alternating voltage in the form of a test signal. Columns 16-19 are connected to ground via a shunt 60 for measuring the current through selected testing location 20-28 and/or selected electrical component 40-48. The measured current is conveyed to an analog-to-digital converter 70. The value output by analog-to-digital converter 70 is forwarded to an analysis device 80, which determines the impedance and/or the phase differential between the current and voltage and/or further characteristics of electrical component 40-48 from the alternating voltage generated by signal generator 50 and the current measured with the aid of shunt 60.

In addition, testing apparatus 10 has a selection device, which selects a testing location 20-28 and thus an electrical component 40-48 by electrically connecting corresponding row 11-13 and column 16-19 to signal generator 50 and shunt 60.

The test signal is a sum signal from a square wave voltage (also referred to as a square wave signal) and a wave-shaped voltage (also referred to as a sinusoidal signal), e.g., a sinusoidal voltage or a sine signal, the square wave voltage and the wave-shaped signal having the same or an identical frequency.

The square wave signal has a high value or maximum value which corresponds to the breakdown voltage of Z diode 30-38 of the selected location. As a rule, all Z diodes 30-38 of testing apparatus 10 have the same breakdown voltage (e.g., +9.0 V). The low value or minimum value of the square wave signal corresponds to the forward voltage of Z diode 30-38 of the selected location. All Z diodes 30-38 of testing apparatus 10 usually have the same forward voltage (e.g., −0.7 V).

The square wave signal is adjusted in such a way that the Z diode becomes conductive at a corresponding instant, which is a function of the phase shift of the type of electrical component 40-48 (for example, the phase shift in a capacitor differs from the phase shift of a coil), so that the current through electrical component 40-48 at selected testing location 20-28 has a form that corresponds to the wave-shaped signal of the test signal (that is, at a sinusoidal voltage signal, the current through electrical component 40-48 has a sinusoidal form at the selected testing location 20-28 or electrical component 40-48).

A sinusoidal signal is added to the square wave signal in order to determine or obtain the test signal. The sinusoidal voltage signal generates the sinusoidal current, so to speak, while the square wave signal is applied simply in order to set Z diode 30-38 of selected testing location 20-28 to the conductive state. Z diodes 30-38 of the other testing locations 20-28 or the not selected testing locations 20-28 remain in the nonconductive state, which means that no current is flowing through electrical components 40-48 of the not selected testing locations 20-28.

The maximum value of the sine voltage has a value such that the maximum voltage of the test signal (that is, the maximum value of the square wave signal plus the maximum value of the sine voltage) lies below double or twice the value of the breakdown voltage of Z diodes 30-38. This ensures that the voltage is applied only at the electrical component 40-48 of the selected location, whereas the other Z diodes 30-38 remain nonconductive.

Analysis device 80 is able to determine the real portion and the imaginary portion of the current and to determine the impedance, phase shift, etc. of electrical component 40-48 on that basis.

FIG. 2 shows a diagram of the test signal (that is, of the voltage signal or test signal) and the resulting current in electrical component 40-48 (or in shunt 60) in the method according to the present invention. The test signal or test voltage signal is shown as a solid line in FIG. 1, while the current measured with the aid of shunt 60 is shown as a dashed line. The values are shown for a capacitor by way of example. The phase shift between the voltage and current thus amounts to 270°.

In the following text, the curve of the voltage (solid line) and the resulting measured current (dashed line) is described from left to right in FIG. 2. To begin with, the square wave signal of the test signal is at the maximum value and the sine signal of the test signal is at the minimum value. Therefore, Z diode 30-38 is conductive because the breakdown voltage is reached by the square wave signal (+9.0 V). The sine signal of the excitation voltage or the test signal rises slowly. The capacitor is charged in the process. When the maximum value of the sine voltage or the sine signal of the test signal is reached, the square wave signal of the test signal is switched to the minimum value (−0.7 V) (which corresponds to the forward voltage of Z diode 30-38). A jump in the solid line therefore results here because the voltage drops within a very short time. The sine voltage of the test signal subsequently drops again. The capacitor is now discharged while the square wave voltage of the test signal remains at the minimum value. Once the minimum value of the sine signal of the test signal is reached, the square wave signal is switched back to its maximum value (+9.0 V) again. The capacitor recharges itself again.

Deviations from the sine form occur in the measured current when the square wave signal is switched from the maximum value to the minimum value and, to a lower extent, when the square wave signal is switched from the minimum value to the maximum value. These deviations are able to be removed by a Fourier transform in analysis device 80. Further smaller deviations from the sine form in the measured current signal are likewise able to be removed by a Fourier transform. From the measured current signal, analysis device 80 determines the impedance of the capacitor and/or the phase shift between the current and voltage. The determined values are able to be compared to reference values in order to determine a quality or performance of the respective electrical component 40-48.

Electronic components 40-48 may include electronic switching circuits, for example.

In addition, testing apparatus 10 includes an electromigration device 90. Electromigration device 90 applies a direct voltage to one or more electronic component(s) 40-48. For example, a potential difference or voltage may be applied between rows 11-13 and columns 16-19. This means that all rows 11-13 have a first potential and all columns 16-19 have a second potential, the first potential differing from the second potential.

The applied direct voltage is greater than the breakdown voltage of the Z diodes 30-38 or the Zener diode(s). The Zener diode becomes conductive as a result and a direct voltage is applied to electronic component 40-48. The applied direct voltage may be considerably higher than the breakdown voltage of Z diodes 30-38 or the Zener diode(s), e.g., at least twice as high, three times as high or more than three times as high. Thus, not only is Z diode 30-38 switched to a conductive state by the direct voltage, but a direct voltage is applied to electronic components 40-48.

By applying the (pure) direct voltage (typically without an alternating voltage component) to electronic components 40-48, an electromigration is induced in electronic components 40-48. In particular, an electromigration may be brought about in a multitude of electronic components 40-48 at the same time.

Through the subsequent testing and/or measuring of the complex impedance of the respective electronic component 40-48, it is possible to examine or analyze after an electromigration has been induced by the application of the direct voltage or after the emergence of electromigration. In particular, errors caused by electromigration are able to be detected in a technically uncomplicated manner.

The magnitude of the direct voltage affects the strength of the electromigration. A higher direct voltage leads to greater electromigration than a low direct voltage.

The direct voltage is able to be applied to electronic components 40-48 of the matrix structure for the same length of time and/or simultaneously for a predefined period of time. For example, to cause electromigration in electronic components 40-48, the direct voltage can be applied for a few minutes, e.g., approximately two minutes or approximately five minutes. It is also conceivable to apply the direct voltage to the various electronic components 40-48 for different lengths of time.

Electronic components 40-48 may have an identical design. This makes it possible to generate very comprehensive statistics. It is therefore possible to identify and analyze even errors that occur only rarely. The number of electronic components 40-48 that are able to be tested by the matrix structure or whose electromigration is able to be examined with the aid of the matrix structure can amount to 4000, for instance.

It is also possible that electronic components 40-48 differ slightly in their development and/or their material composition. This makes it possible to carry out a type of series test in order to determine which particular changes raise or lower the susceptibility to electromigration.

It is possible that testing apparatus 10 has an optical camera or multiple optical cameras, such as a microscope camera. The camera(s) detect(s) electromigration of electronic components 40-48 in an optical manner.

Testing apparatus 10 may include a classification device, which classifies the detected optical changes or electromigration structures of electronic components 40-48 and/or the measured impedance values of electronic components 40-48. A statistical analysis is able to be performed on the basis of the classification. For example, it is possible to determine under which condition and how often or to what extent electromigration occurs and/or which types of electromigration structures are produced. In addition, it may be determined to which types of errors this leads.

The environmental conditions, e.g., dewing/moisture or humidity, temperature and/or ionic contamination, are selectively adjustable and the derived values can be stored and analyzed together with the test values or measured values.

The classification device may use machine learning, in particular neural networks, for classifying the electromigration of electronic components 40-48. An image detection is also able to be carried out.

Since electromigration structures can structurally be described in a good approximation by fractals, in particular by Julia sets, fractal calculation rules are able to be utilized for the classification with the aid of the classification device.

A classification characteristic of the electromigration structure may be its fractal dimension. The created dendrites of the electromigration structure of electronic components 40-48 are able to be classified with the aid of the classification device.

In addition, the merging of the electrical and optical information of the electromigration can be utilized for classification purposes for electrical (substitute) models, similar to the substitute models used in electrochemical impedance spectroscopy.

Testing apparatus 10 may be used as a sacrificial structure and/or measuring structure for a control device of a motor vehicle. Testing apparatus 10 is able to be placed at a location in the motor vehicle where electronic components 40-48 are particularly susceptible to electromigration. For instance, this means that the humidity, temperature and/or ionic contamination at the location of testing apparatus 10 is/are greater than at the location of the control device.

A failure of an electronic component 40-48 of testing apparatus 10 thus occurs before a failure of an electronic component 40-48 of the control device. The failure is able to be detected. If a failure was detected, a warning may be output, e.g., acoustically and/or optically. For example, a warning light of the motor vehicle on the instrument panel may light up and/or a prompt "Please visit a repair shop" may be output. A failure of the control device is therefore reliably prevented.

After the direct voltage has been applied to produce the electromigration, the testing method is executed. The direct voltage may subsequently be applied anew to produce the electromigration.

It is also possible that an electronic component 40-48 tested and/or developed by testing apparatus 10 is used as a sacrificial structure or measuring structure.

Figure 3:
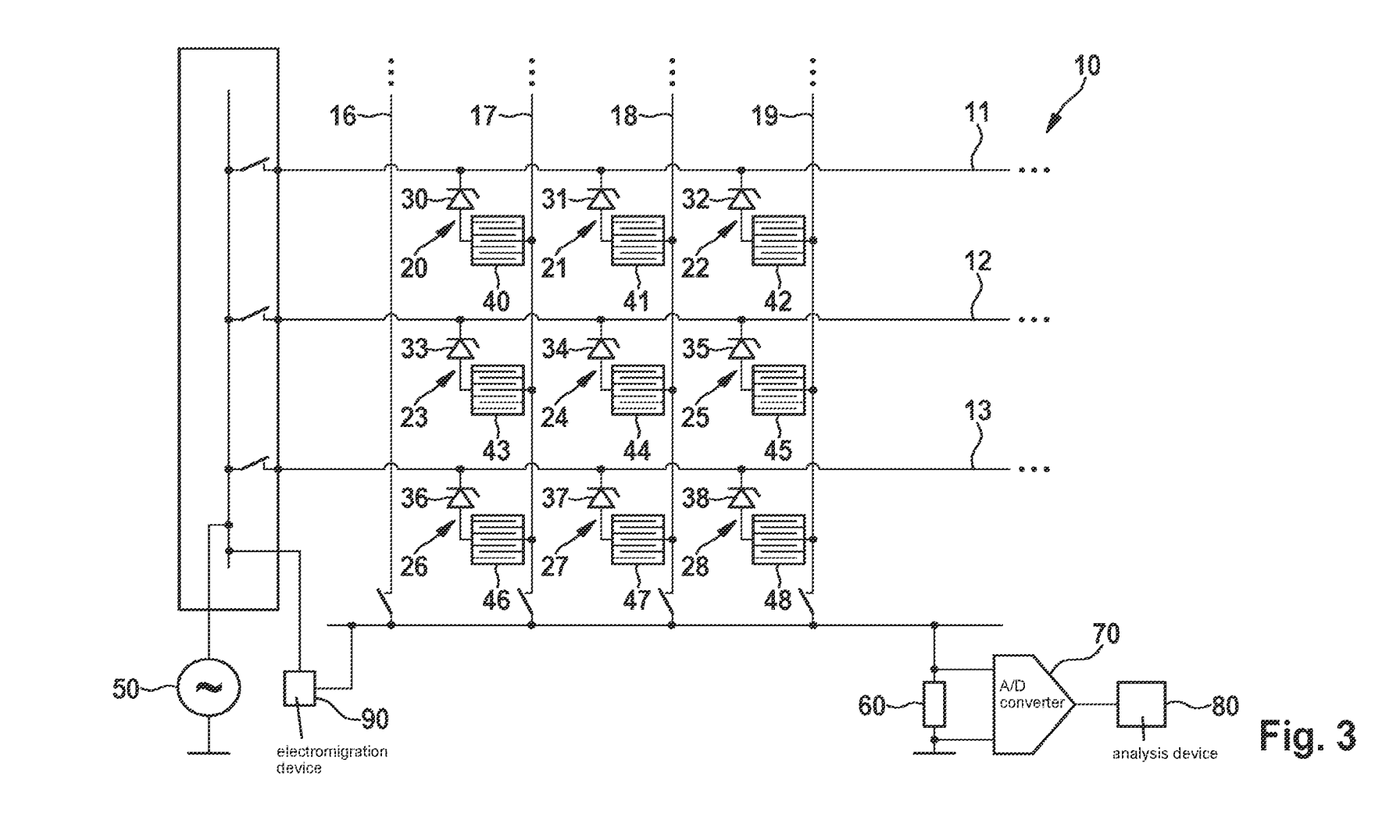
FIG. 3 shows a schematic top view of a second example embodiment of the testing apparatus according to the present invention.

FIG. 3 shows a schematic top view of a second embodiment of testing apparatus 10 according to the present invention. Instead of electrical components, a conductor track structure 50-58 is tested in testing apparatus 10 of FIG. 3. In all other respects, the second embodiment of testing apparatus 10 according to the present invention does not differ from the first embodiment according to the present invention.

Conductor track structures 50-58 may have the same design or may (partially) differ from one another in their design.

It should finally be pointed out that terms such as "having", "including", etc. do not exclude any other elements or steps and a term such as "a" does not exclude a multiplicity.

What is claimed is:

1. A testing apparatus for testing electrical components and/or conductor track structures, the testing apparatus comprising:
   a multitude of testing locations, each configured to receive a respective electrical component and/or a conductor track structure;
   a selection device configured to select one of the testing locations;
   electrical lines disposed in rows and electrical lines disposed in columns for supply of an alternating voltage to the respective electrical component and/or conductor track structure situated at the selected testing location;
   Z diodes for the electrical connection of the respective electrical component and/or conductor track structure at the selected testing location via a respective Z diode of the Z diodes to one of the rows of electrical lines;
   a signal generator configured to generate a test signal that has a voltage signal as a sum of a square wave signal and a wave-shaped signal, a maximum voltage of the square wave signal corresponding at least to a breakdown voltage of the respective Z diode of the selected testing location; and
   an electromigration device configured to apply a direct voltage signal to the respective electrical components and/or conductor track structures for production of electromigration in the respective electrical components and/or conductor track structures, a voltage of the direct voltage signal being greater than the breakdown voltage of the respective Z diode of the selected testing location.

2. The testing apparatus as recited in claim 1, further comprising:
   a camera for acquiring electromigration structures of the respective electrical components and/or conductor track structures.

3. The testing apparatus as recited in claim 2, further comprising:
   a classification device configured to classify the electromigration structures acquired by the camera.

4. The testing apparatus as recited in claim 3, wherein the classification device is configured to classify the electromigration structures acquired by the camera using machine learning.

5. The testing apparatus as recited in claim 3, wherein the classification device is configured to assign each of the electromigration structures acquired by the camera to fractals and/or to a fractal dimension.

6. The testing apparatus as recited in claim 1, wherein the selected respective electrical component and/or conductor track section is used as a sacrificial structure for a control device.

7. A control device system for a motor vehicle, comprising:
   a control device configured to control of at least parts of the motor vehicle; and
   a testing apparatus for testing electrical components and/or conductor track structures, the testing apparatus comprising:
      a multitude of testing locations, each configured to receive a respective electrical component and/or a conductor track structure,
      a selection device configured to select one of the testing locations,
      electrical lines disposed in rows and electrical lines disposed in columns for supply of an alternating voltage to the respective electrical component and/or conductor track structure situated at the selected testing location,
      Z diodes for the electrical connection of the respective electrical component and/or conductor track structure at the selected testing location via a respective Z diode of the Z diodes to one of the rows of electrical lines,
      a signal generator configured to generate a test signal that has a voltage signal as a sum of a square wave signal and a wave-shaped signal, a maximum voltage of the square wave signal corresponding at least to a breakdown voltage of the respective Z diode of the selected testing location, and an electromigration device configured to apply a direct voltage signal to the respective electrical components and/or conductor track structures for production of electromigration in the respective electrical components and/or conductor track structures, a voltage of the direct voltage signal being greater than the breakdown voltage of the respective Z diode of the selected testing location;

wherein the control device system is configured in such a way that a higher and/or longer lasting direct voltage signal and/or a higher field strength of an electrical field is applied to the respective electrical components and/or conductor track structures of the matrix structure than to electrical components and/or conductor track structures of the control device.

8. A method for testing electrical components and/or conductor track structures situated at testing locations of a testing apparatus, the testing apparatus including a multitude of testing locations, each configured to receive a respective electrical component and/or conductor track structure, and electrical lines disposed in rows and electrical lines disposed in columns for supply of an alternating voltage to the respective electrical component and/or conductor track section situated at a selected testing location, the testing apparatus further including Z diodes for an electrical connection of the respective electrical component and/or conductor track structure at the selected testing location via one of the Z diodes to one of the rows of the electrical lines, the method comprising the following steps:

applying a direct voltage signal to one or more of the respective electrical components and/or conductor track structures using the rows of electrical lines and the columns of electrical lines to produce electromigration in the one or more respective electrical components and/or conductor track structures, a voltage of the direct voltage signal being greater than a breakdown voltage of the respective Z diode of each of the one or more respective electrical components and/or conductor track structures;

selecting a testing location using the rows of electrical lines and the columns of electrical lines; and supplying the respective electrical component and/or conductor track structure situated at the selected testing location with a test signal that has a voltage signal as the sum of a square wave signal and a wave-shaped signal, wherein a maximum voltage of the square wave signal corresponds at least to the breakdown voltage of the Z diode of the selected testing location.

9. The method as recited in claim 8, wherein respective electromigration structures of the electrical components and/or the conductor track structures are acquired in an optical manner.

10. The method as recited in claim 9, wherein the optically acquired electromigration structures are classified, using machine learning.

11. The method as recited in claim 9, wherein each of the optically acquired electromigration structures are assigned to fractals including Julia sets, and/or to a fractal dimension.

12. The method as recited in one of claim 8, wherein at least a portion of the respective electrical components and/or conductor track structures has a different development relative to at least another of the respective electrical components and/or conductor track sections.

* * * * *